United States Patent
Kashioka et al.

[11] 4,044,311
[45] Aug. 23, 1977

[54] FEATURE EXTRACTION SYSTEM FOR EXTRACTING A PREDETERMINED FEATURE FROM A SIGNAL

[75] Inventors: Seiji Kashioka, Kokubunji; Masayoshi Kameyama, Sagamihara; Masakazu Ejiri, Tokorozawa; Takahumi Miyatake, Hachioji, all of Japan

[73] Assignee: Hitachi, Ltd., Japan

[21] Appl. No.: 648,711

[22] Filed: Jan. 13, 1976

[30] Foreign Application Priority Data

Jan. 16, 1975 Japan .................... 50-6276

[51] Int. Cl.² ........................... H03B 1/00
[52] U.S. Cl. .................. 328/139; 328/116; 328/151
[58] Field of Search ............ 328/139, 151, 115, 116, 328/117

[56] References Cited

U.S. PATENT DOCUMENTS

| | | | |
|---|---|---|---|
| 2,862,105 | 11/1958 | Boyer et al. | 328/151 X |
| 3,348,216 | 10/1967 | Vinson | 328/151 X |
| 3,543,050 | 11/1970 | Paine | 328/116 X |
| 3,689,879 | 9/1972 | Burdick | 328/139 X |
| 3,891,930 | 6/1975 | Petrusson | 328/117 |
| 3,925,613 | 12/1975 | Kokado | 328/139 X |

*Primary Examiner*—John S. Heyman
*Attorney, Agent, or Firm*—Craig & Antonelli

[57] ABSTRACT

A feature extraction system comprises first and second memory circuits and a control circuit for controlling a storing period of time when signals are stored in the first memory circuit. The first and the second memory circuits comprise capacitor memory circuits, the time constant of the second memory circuit being larger than that of the first memory circuit. First and second comparators are coupled to the first and the second memory circuit, respectively. Signals supplied to the first memory circuit are compared with the contents thereof by the first comparator, so that the maximum signal thereof within a predetermined period of time controlled by the control circuit is stored in the first memory circuit. After the predetermined period of time, the contents of the first memory circuit are supplied to the second memory circuit and then the first memory circuit operates to store the maximum signal of the signals supplied to the first memory circuit within a next predetermined period of time. Signals from the first memory circuit are compared with the contents thereof by the second comparator in order to extract the maximum signal of the signals from the first memory circuit, which is stored in the second memory circuit, whereby the maximum signal in the signals supplied to the first memory circuit can be accurately extracted.

15 Claims, 10 Drawing Figures

FEATURE EXTRACTION SYSTEM FOR EXTRACTING A PREDETERMINED FEATURE FROM A SIGNAL

BACKGROUND OF THE INVENTION

This invention relates to a feature extraction system to detect a required feature from certain signals, and more particularly, to a feature extraction circuit applied to a pattern recognition system.

Techniques for extracting required feature from certain signals are utilized in various field such as a pattern recognition, the examination of manufactured products, measuring systems and automatic control systems, in which a feature extraction circuit is required to operate in quick response to certain signals. In other words, signals output from certain systems such as a pattern recognition system and a temperature measuring system are generally changed when parameters, such as a position, a temperature, a voltage and a time, with respect to the systems vary. In this case, it is important to detect the required feature from the certain signals and to record the values of the parameters corresponding thereto at that time, in order to evaluate the manufactured products and the results of the meansurements, and to control other systems. It is well known that analog memory circuits including capacitar memories are generally used in order to store the required feature and the values of the parameters. The capacitor memories, however, must be small in the time constant thereof to operate in high response to the signals so that it cannot maintain a necessary value for a predetermined period of time since the contents of the capacitor memories are decayed fast. On the contrary, if the time constant of the capacitor memory is made large in order to maintain the necessary value supplied thereto for a predetermined period of time, it cannot be operated in quick response to the signals. In order to resolve the above disadvantages, digital memory circuits may be utilized. In this case, an analog-digital converter is needed in order to convert the analog signals supplied to the memory circuit into the digital signals. The high speed analog-digital converter, however, is required which the period of the repetition is very short and it is high cost. Further, the analog-digital converter applied to the above systems which is required to operate in high speed response to the signals may not be realized even by a conventional high speed analog-digital converter.

SUMMARY OF THE INVENTION

An object of this invention is to provide a feature extraction system which operates in quick response to signals and extracts a required feature therefrom.

Another object of this invention is to provide a feature extraction system which extracts the required feature from the signals and store the values of parameters corresponding thereto.

Further object of this invention is to provide a feature extraction system which extracts the required feature from intermittent signals.

Still further object of this invention is to provide a feature extraction system extracting the required feature from continuous signals.

In order to achieve the above objects, the feature extraction system of this invention comprises two stages. In the first stage, a required feature such as a maximum or a minimum signal, for example, is detected from signals stored during each predetermined period of time. The first stage has a capacitor memory of a small capacity in order to store the required feature. The required feature detected in the first stage is supplied to the second stage in the end portion of each predetermined period of time and the optimum feature is extracted therein from all of the signals which are received from the first stage and stored therein. The second stage is so designed that the contents stored therein are held for a long period of time in comparison with that in the first stage. The optimum feature extracted in the second stage is utilized to evaluate the manufactured products and the results of the measurements, and to control other systems.

The above and other objects will be understood from the description in connection with the following drawing.

BRIEF DESCRIPTION OF THE DRAWING

FIG. 9b is a diagram of a time chart for explaining the operation of the system shown in FIG. 9a.

DESCRIPTION OF THE PRIOR ART

Figure 1:
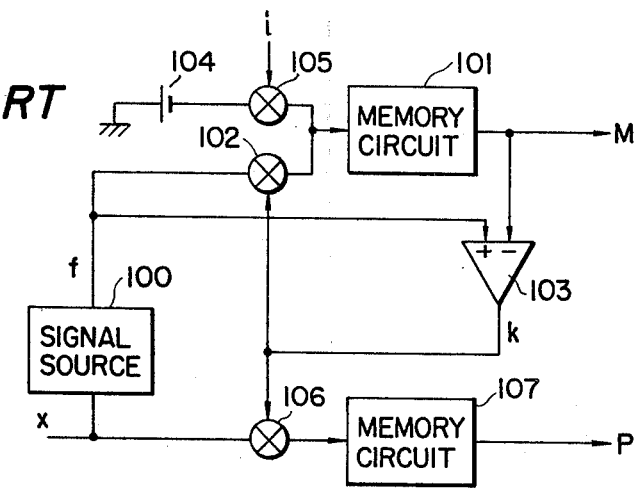
FIG. 1 is a schematic block diagram of a conventional feature extraction system.
Figure 2:
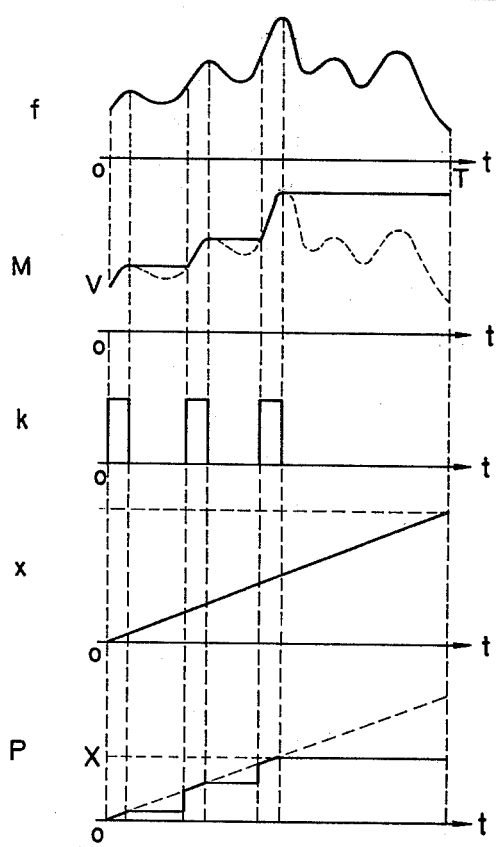
FIG. 2 is a diagram of a time chart for explaining the operation of the system shown in FIG. 1.

Referring to FIGS. 1 and 2, a signal source 100 generates the signal $f$. The signal source 100, for instance, is an apparatus which generates the signal $f$ indicating the degree of the coincidence between a standard pattern and an input image of a LSI (large scale integration) for instance, in a pattern recognition system, where the signal f is shown as the function of a time $t$. The output of the signal source 100 is supplied to a memory circuit 101 comprising a capacitor memory through a gate circuit 102 and to a comparator 103. The initial value of the memory circuit 101 is set by a voltage source 104 when a gate circuit 105 is opened by a gate signal $i$. A position signal $x$ is supplied to the signal source and a memory circuit 107 through a gate circuit 106. The position signal $x$ is given when an image pick-up tube scans the image of the sample in the pattern recognition system. The output M of the memory circuit 101 is supplied to the comparator 103, the output of which is supplied to the gate circuits 102 and 106 is order to gate them.

The operation of the above system will be explained. The gate signal $i$ as applied to the gate circuit 105 at $t =$ 0 so that the voltage V of the voltage source 104 is set to the memory circuit 101. When the time $t$ varies continuously from 0 to T, the output of the signal source 100 is changed such as the signal f. In the comparator 103, the output of the signal source 100 is compared with the output of the memory circuit 101. As a result, when the output of the signal source 100 is larger than the output M of the memory circuit 101, the comparator 103 generates a signal to open the gate circuits 102 and 106, whereas when the output of the signal source 100 is smaller than that of the memory circuit 101, the gate circuits 102 and 106 are closed. The output of the comparator 103 is shown by a signal k in FIG. 2. Accordingly, the contents of the memory circuits 101 and 107 are rewritten to the signal f and the position signal x, respectively, only when the output of the signal source 100 is larger than the output M of the memory circuit 101, so that the memory circuit 101 stores the maximum value M of the signal f during the period of the T and the memory circuit 107 stores the position P at that time. After the time T, the memory circuits 101 and 107 can output the signals M and P shown in FIG. 2. In the above example, it is needless to say that the maximum value M corresponds to the optimum matching pattern in the pattern recognition system and the position P shows the position thereof in the input image of the LSI.

Figure 3:
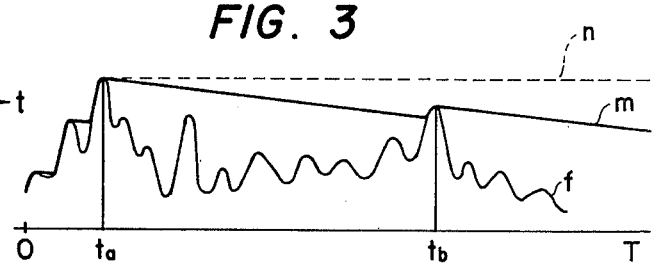
FIG. 3 is a diagram for explaining the operation of the system shown in FIG. 1.

The above conventional system has following disadvantages since the memory circuit 101 is constructed using a capacitor memory. When the capacity of the capacitor memory is made large, in order to prevent the contents stored in the capacitor memory from decaying, the settling time of the capacitor memory becomes long. As a result, the contents stored in the capacitor memory is not rewritten in response to the signal f and the optimum signal cannot be extracted from the signal f. On the contrary, when the capacity of the capacitor memory is made small, the time constant thereof is small so that the contents of the capacitor memory decays in a short period of time. As a result, the right maximum value of the signal f may not be stored in the memory circuit 101, as shown in FIG. 3. In FIG. 3, it is assumed that the maximum value of the signal f is produced at $t = ta$. If the contents stored in the memory circuit 101 do not decay, the maximum value at $t = ta$ is maintained during the period of the T as shown by a dotted line n. The maximum value is rewritten at $t = tb$ as shown in FIG. 3, since the contents of the actual memory circuit 101 decay as shown by a solid line m. Accordingly, when the contents of the memory circuit 101 is read out at $t = T$, an incorrect maximum value is detected therefrom and an error due to the decay is added thereto. Further, the position P obtained at that time is incorrect since the time $t$ is changed from $ta$ to $tb$. For this reason, the conventional system cannot operate in quick response to the signal and at the same time extract the maximum value from signal continuing for a long period of time.

Although the above memory circuit has been constructed using a capacitor memory, it may be constructed with a digital memory such as a register, the contents of which can be maintained for a long period of time with high accuracy. An expensive, high speed A-D converter, however, is needed in order to convert an analog signal into a digital signal since the output signal of the signal source 100 is the analog signal.

DESCRIPTION OF THE PREFERRED EMBODIMENTS

Figure 4:
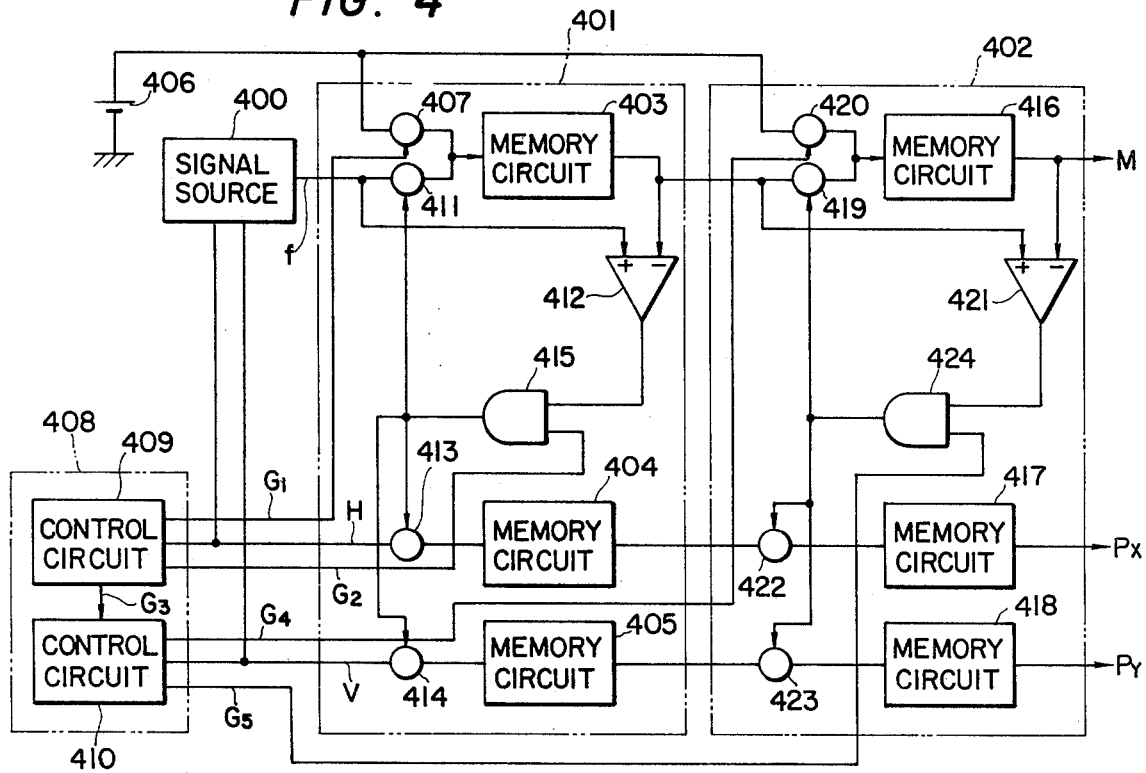
FIG. 4 is a schematic block diagram of an embodiment of this invention.
Figure 5:
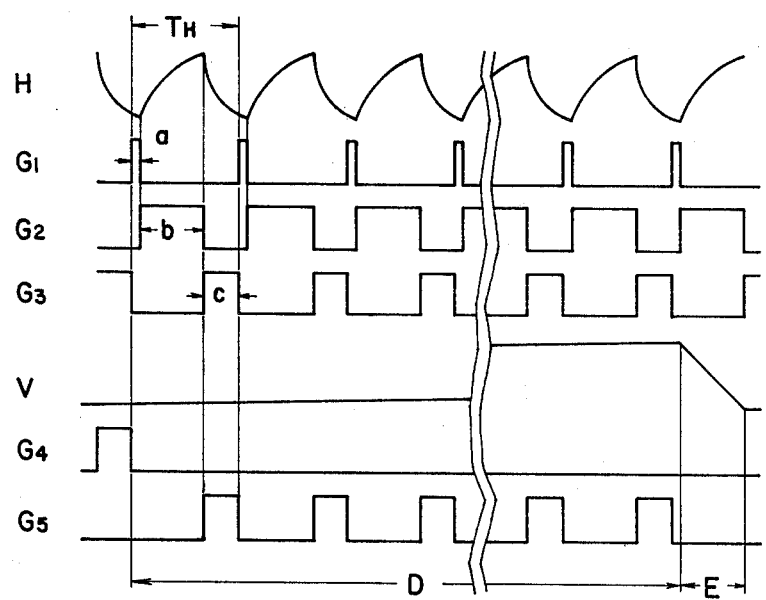
FIG. 5 is a diagram of a time chart for explaining the operation of the system shown in FIG. 4.

Referring now to FIG. 4, a signal source 400, for example, is an apparatus which generates the signal f for indicating the degree of the coincidence in the pattern recoginition system as have been described above, and for evaluating the manufactured products and the results of the measurements. The signal source 400, hereinafter, will be explained as an apparatus which generates the signal f for indicating the degree of the coincidence between a standard pattern and sample of a LSI in the pattern recognition system. In the pattern recognition system, it is well known that the portions of the LSI sample corresponding the standard pattern is detected by using an industrial TV camera, whereby a bonding machine for bonding automatically lead wires to the predetermined electrodes in the LSI sample is controlled. The industrial TV camera has 240 lines as a horizontal scanning with respect to one vertical scanning line. The relationship between the horizontal scanning lines and the vertical scanning line is shown by the signals H and V in FIG. 5. The scanning period of the one picture element is about $1.7 \times 10^{-7}$ sec and the scanning period of the one frame is about $1.7 \times 10^{-2}$ sec in the industrial TV camera, so that the ratio between the scanning periods of the one picture element and of the one frame is $10^5$. In this case, a feature extraction system is required to detect a feature such as a maximum signal, for instance, from a signal f which is produced from the signal source 400 in each scanning period of one picture element, and further to store the detected feature during the scanning period of one frame in order to extract the maximum signal of all the features detected in each scanning period of one frame. For this purpose, a feature extraction system of this invention comprises two stages 401 and 402. The first stage 401 detects a maximum value from the signal f generated during the predetermined period of time, where the signal f is the output signal of the signal source 400 during a one horizontal scanning period. The first stage 401 comprises three memory circuits 403, 404 and 405. The first memory circuit 403 comprises a capacitor used as a capacitor memory, which is so designed as to respond in high speed corresponding to the scanning period of one picture element and to hold the contents thereof for one horizontal scanning period. The settling time of the capacitor, for instance, is about 50 n sec. In other word, the capacity of the capacitor is made very small. The second and the third memory circuits 404 and 405 may be constructed as same as the first memory circuit 403. The initial value of the first memory circuit 403 is set by a voltage source 406 through a gate circuit 407, to which a gate signal $G_1$ from a control circuit 408 is applied. The control circuit 408 comprises a first and a second control circuits 409 and 410. The first control circuit 409 comprises a plurality of signal generators for producing the gate signal $G_1$ for the gate circuit 407, a saw tooth wave H for the scanning of the TV camera which corresponds to the x position of X-Y co-ordinate system, a gate signal $G_2$ and a trigger pulse $G_3$ for the second control circuit 410 as shown in FIG. 5. The second control circuit 410 comprises a plurality of signal generators for producing gate signals $G_4$ and $G_5$, and a saw tooth wave V for the scanning of the TV camera which corresponds to the y position of the X-Y co-ordinates system as shown in FIG. 5.

The output of the signal source 400 is supplied to the first memory circuit 403 through a gate circuit 411 and a comparator 412, to which the output of the first memory circuit 403 is supplied. When the gate signal $G_1$ is applied to the gate circuit 407, the initial value of the memory circuit 403 is set by the voltage source 406 at the period a in the one horizontal scanning cycle TH shown in FIG. 5. The outputs of the signal source 400 and the first memory circuit 403 are compared in the comparator 412, the output of which is applied to gate circuits 411, 413 and 414 through an AND gate circuit 415. The gate signal $G_2$ from the first control circuit 409 is the pulse signal corresponding to one horizontal scanning period b. The pulse signal, however, may be such a pulse train having a high frequency that the information of the signal f can be extracted. When the output of the signal source 400 is larger than that of the first memory circuit 403, the comparator 410 generates an output signal and opens the gate circuits 411, 413 and 414, so that the contents of the memory circuit 403 are rewritten by the output signal f of the signal source 400, and at the same time, the x and y positions are stored in the second and the third memory circuits 404 and 405 through the gate circuits 413 and 414, respectively, whereas when the output of the signal source 400 is smaller than that of the first memory circuit 403, the gate circuits 411, 413 and 414 are closed so that the contents of the memory circuits 403, 404 and 405 are maintained. Accordingly, the feature such as the maximum value of the signal f from the signal source 400 in the one horizontal scanning period b is detected and stored in the first memory circuit 403, and the x and y positions at that time are stored in the second and the third memory circuits 404 and 405.

Next, the second stage 402 will be explained, which comprises a fourth, a fifth and a sixth memory circuits 416, 417 and 418. The output of the memory circuit 403 of the first stage 401 is supplied to the fourth memory circuit 416 through a gate circuit 419 at the period C of the gate signal $G_5$ shown in FIG. 5 since the signal is absent in the fly-back period. The initial value of the fourth memory circuit 416 is set by the voltage source 406 when the gate signal $G_4$ is applied to gate circuit 420 from the second control circuit 410. The fourth memory circuit 413 comprises a capacitor used as a capacitor memory, the capacity of which is about $0.03\mu$ F, for instance. The fourth memory circuit 416 is not needed to respond to the signal f from the signal source 400. Accordingly, the fourth memory circuit 416 is so designed as to respond to the output of the first memory circuit 403 and to hold the contents thereof for a long period of time such as the scanning period D of the one frame shown in FIG. 5. Namely, the time constant of the fourth memory circuit 416 is larger than that of the first memory circuit 403. The memory circuits 417 and 418 may be constructed as same as the memory circuit 416.

The outputs of the first memory circuit 403 and the fourth memory circuit 416 are supplied to a comparator 421 and are compared, the output of which is applied to gate circuits 419, 422 and 423, respectively, through an AND gate circuit 424, to which the gate signal $G_5$ from the second control circuit 410 is applied. The second control circuit 410 is actuated by the trigger pulse $G_3$ so that the gate signal $G_5$ having the period C in the horizontal fly-back period shown in FIG. 5 is formed. When the output of the first memory circuit 403 is larger than that of the fourth memory circuit 416, the gate circuits 419, 422 and 423 are opened so that the contents of the fourth memory circuit 416 are rewritten by the output of the first memory circuit 403 and at the same time, the contents of the fifth and the sixth memory circuits 417 and 418 are rewritten by the outputs of the second and the third memory circuits 404 and 405, respectively. Accordingly, when the operation of the above feature extraction system of this invention is performed over the one frame, the optimum feature such as the maximum value therein is extracted. In other words, the information relating to the optimum degree of the coincidence between the standard pattern and the portion of the LSI sample is stored in the fourth memory circuit 416 and the output M thereof is obtained. At same time, the positions x and y of the X-Y co-ordinate system which indicates the position of the portion of the LSI sample matching with the standard pattern are obtained as the outputs $P_x$ and $P_y$, respectively. The outputs M, $P_x$ and $P_y$ as have been described above are read out at a period E shown in FIG. 5, such as the fly-back period of a vertical scanning and are utilized in order to display, to record and to control other systems (not shown).

In the above embodiment, the memory circuits 416, 417 and 418, each of which comprises a capacitor memory have been described, but the feature extraction system of this invention is not limited them. The each memory circuit of the second stage 402 may be constructed by a digital memory circuit such as a conventional register.

Figure 6:
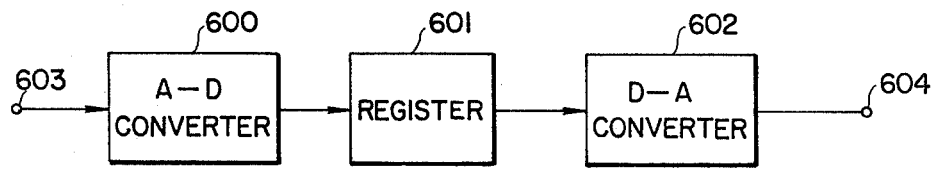
FIG. 6 is a schematic block diagram of a portion of an embodiment of this invention.

FIG. 6 shows an embodiment of a digital memory circuit, in which reference numerals 600, 601, and 602 designate an A-D converter, a register and a D-A converter, respectively. A terminal 603 is connected to the respective gate circuits 419 and 420 of the second stage 402. The analog signals from the gate circuits 419 and 420 are converted into the digital signals by the A-D converter 600, which are stored in the registor 601. The output of the register 601 is supplied to the comparator 421 through the D-A converter 602, by which the digital output signal of the register 601 is converted into the analog signal in order to be compared with the output of the first memory circuit 403. In this embodiment, the A-D converter 600 can use a conventional A-D converter since it is not required to operate in high speed as have been described. The respective memory circuits 417 and 418 may be constructed by the digital memory circuits as have been explained above. Furthermore, the third memory circuit 405 and the gate circuit 414 can be omitted and the vertical scanning signal V can be directly supplied to the sixth memory circuit 418 through the gate circuit 423 since the variation of the vertical scanning signal V in the period TH shown in FIG. 5 is very small. Namely, the difference between the vertical scanning signal levels in the period of one horizontal scan and in the fly-back period thereof is very small.

In the above embodiments, the feature extraction system which is applied to extract the signals relating to two parameters such as the x and y positions, has been described, but the principle of this invention can be applied to the feature extraction system for extracting the signals relating to m parameters, where $m = 1,2,3,$ ...

Figure 7:
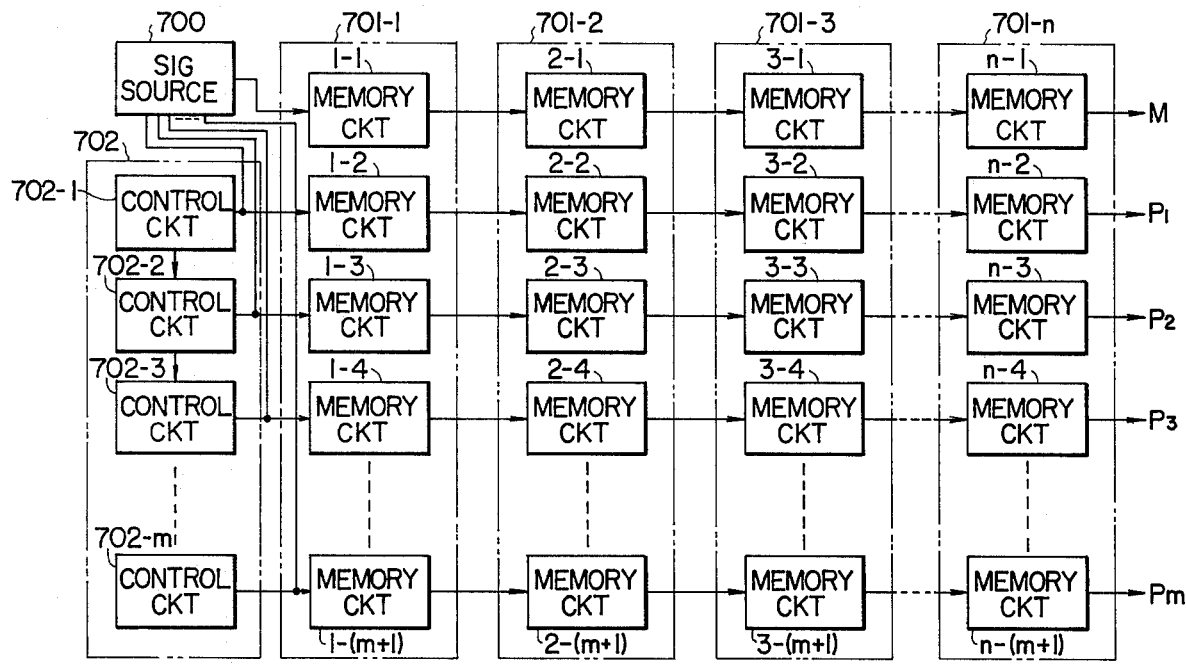
FIGS. 7 and 8 are schematic block diagrams of modified embodiments of this invention.

Referring now to FIG. 7, in which a signal source 700 generates the required signals as have been described above. A control circuit 702 comprises a first control circuit 702-1, a second control circuit 702-2, . . . and a mth control circuit 702-m. The number of the control circuits corresponds to that of the parameters which need to be detected. The feature extraction system of this embodiment comprises n stages, where $n = 1,2,3, \ldots$, each of which has $(m + 1)$ pieces of memory circuits. A voltage source for setting the initial conditions of respective memory circuits 1-1, 2-1, . . . n−1, gate circuits and comparators, etc. are omitted since the concrete construction of this embodiment is as same as that of the embodiment shown in FIG. 4. The time constant of the memory circuit in an arbitrary stage is so designed that it is longer than that of the memory circuit in a pre-stage. By the above construction, the required feature of the signals from the signal source 700 is obtained as the output M of the memory circuit $n-1$ of the nth stage 701-$n$, and at the same time the outputs $P_1$, $P_2$, $P_m$ relating to m parameters are obtained from the memory circuits $n-2$, $n-3$ ... $n - (m + 1)$, respectively. In this embodiment, if the memory circuits 2-1,2-2 ... 2 − ($m$ + 1) of the second stage 701-2 are constructed by digital memory circuits, respectively as shown in FIG. 6, the later stage thereof can be omitted.

Figure 8:
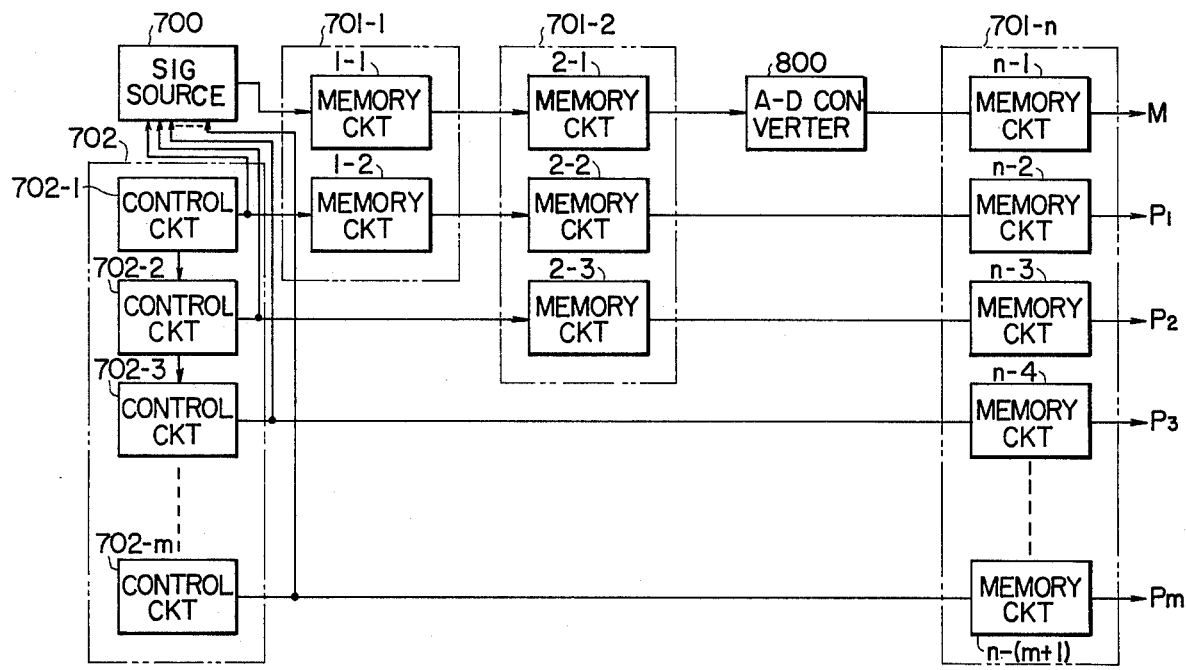

In the embodiment shown in FIG. 7, the each stage has ($m$ + 1) pieces of the memory circuits, but some of the memory circuits can be omitted. The typical embodiment in this case is shown in FIG. 8, in which elements corresponding to those shown in FIG. 7 are designated by the same reference numerals. A reference numeral 800 designates an A-D converter so that only a memory circuit $n-1$ of the nth stage is a digital memory circuit such as a register in this embodiment. When the variations of signals relating to parameters, in turn, become small in the order of the control circuits 702-1, 702-2, ... 702-$m$, the memory circuits in the each stage can be arranged as shown in FIG. 8. Although the memory circuit $n-1$ of the nth stage is constructed by the digital memory circuit in this embodiment, the memory circuits $n-2$, $n-3$, ... $n-(m+1)$ can be constructed by the registers when the A-D converters are placed before them, respectively.

Now, in the above embodiments, the period such as the horizontal fly-back period is utilized to set the initial condition of the memory circuit and to supply the contents of the memory circuits of a stage to the memory circuits of a next stage since the signal from the signal source absents during that period. In other words, the above embodiments generally are effective to extract the feature from intermittent signals and periodic signals. However, they cannot be utilized to extract the feature from continuous signals, since they cannot extract the feature therefrom when the contents of the memory circuits of the first stage are supplied to the memory circuits of the stage stage.

Figure 9A:
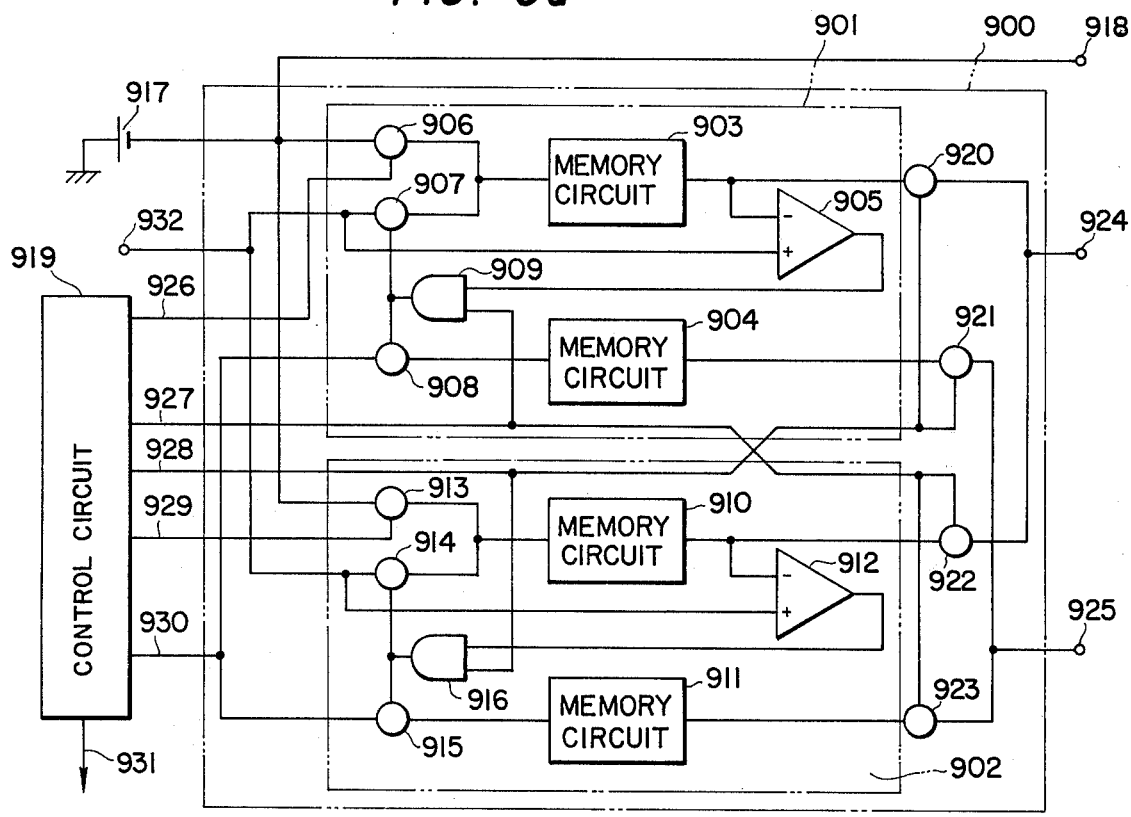
FIG. 9a is a schematic block diagram of a further modified embodiment of this invention.

An embodiment of this invention shown in FIG. 9a can be utilized in order to overcome the above disadvantage. Referring to FIG. 9a, the feature extraction systen of this invention is shown only a first stage, and a second stage and other stages thereafter are omitted since their constructions are understood apparently from the above description. Further, a signal relating to one parameter is extracted in this embodiment. The first stage 900 comprises two portions 901 and 902 having same constructions to each other. The one portion 901 of the first stage 900 comprises two memory circuits 903 and 904, a comparator 905 and gate circuits 906, 907, 908 and 909 corresponding to the memory circuits 403 and 404, the comparator 412 and the gate circuits 407, 411, 413 and 415 shown in FIG. 4, respectively. The other portion 902 includes memory circuits 910 and 911, a comparator 912 and gate circuits 913, 914, 915 and 916. A voltage source 917 is provided to set in initial values of the memory circuits 903 and 910 and memory circuits of the second stage (not shown), the terminal 918 of which is coupled thereto. A reference numeral 919 designates a control circuit. Terminals 924 and 925 are coupled to the second stage.

Figure 9B:
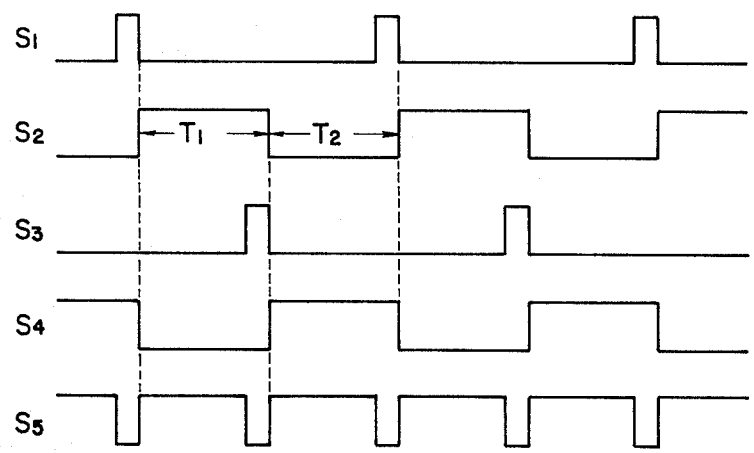

The operation of this embodiment will be explained referring to FIG. 9b.

First of all, a gate signal $S_1$ is applied to the gate circuit 906 from the line 926 of the control circuit 919, so that the initial value of the memory circuit 903 is set by the voltage source 917. A continuous signal f is applied to a terminal 932, to which the memory circuits 903 and 910 are coupled through the gate circuits 907 and 914.

Next, a gate signal $S_2$ is supplied to the AND gate circuit 909 and the gate circuits 922 and 923 from the line 927 of the control circuit 919, as well as a gate signal $S_4$ is supplied to the AND gate circuit 916 and the gate circuits 920 and 921 from the line 928 of the control circuit. Accordingly, in the period $T_1$ of the gate signal $S_2$, the AND gate circuit 909 and the gate circuits 922 and 923 are opened whereas the AND gate circuit 916 and the gate circuits 920 and 921 are closed, so that the one portion 901 including the memory circuits 903 and 904 operates to extract the required feature from the signal f applied to the terminal 932 and the other portion 902 including the memory circuits 910 and 911 operates to supply the contents of the memory circuits 910 and 911 to the second stage through the terminals 924 and 925. A gate signal $S_3$ is applied to the gate circuit 913 in the end portion of the gate signal $S_2$ in order to set the initial value of the memory circuit 910. In the period $T_2$ of the gate signal $S_2$, the one portion 901 operates to supply the contents of the memory circuits 903 and 904 to the second stage through the terminals 924 and 925, and the other portion 902 operates to extract the required feature from the signal f. In other words, the portions 901 and 902 operate alternately to extract the required feature from the continuous signal f. A line 930 of the control circuit 919 is connected to the gate circuits 908 and 915 in order to supply the information relating to the parameter to the memory circuits 904 and 911. A line 931 of the control circuit 919 is provided to actuate a next control circuit (not shown). Although this embodiment is the case where the portions 901 and 902 operate alternately to extract the required feature, their operations for extracting the required feature may be so designed as to overlap, if the period for suppling the signal from the first stage to the second stage can make short. The feature extraction system of this invention can be easily designed by the above construction since it is difficult to be effected by the time lag of the elements thereof if the time lag does not deviate so large.

In the above respective embodiments, the analog signals relating to the parameters have been utilized as the outputs of the control circuits, but the digital signals into which the analog signals are converted may be output from the control circuits. In these cases, the memory circuits for storing the information relating to the parameters are constructed by the digital memory circuits such as registers, and the memory circuits for storing the information of the parameters arranged in the second stage and in the stage thereafter can be omitted.

While only a few forms of this invention have been shown and described, many modification will be apparent to those skilled in the art within the spirit and scope of the invention as set forth in the appended claims.

We claim:

1. A feature extraction system for extracting a predetermined feature from a signal comprising:
    first means, to which said signal is applied for extracting sequentially said predetermined feature from said signal during a predetermined time period and for storing the extracted predetermined feature in said time period, said first means extracting said predetermined feature during every predetermined time period;

second means coupled with said first means, for extracting an optimum predetermined feature from the predetermined features extracted by said second means and for storing said optimum predetermined feature, said second means being so designed that the contents stored therein are held for a long period of time in comparison with that stored in said first means; and third means coupled with said second and first means for controlling said second and first means to extract said predetermined feature from said signal and then to transfer the contents of said first means to said second means at the end portion of the predetermined time period.

2. A feature extraction system according to claim 1, wherein said first means and said second means include first and second memory means, respectively, the time constant of said first memory means being shorter than that of said second memory means.

3. A feature extraction system according to claim 2, wherein said first and second memory means are capacitor memories.

4. A feature extraction system according to claim 2, wherein said first and second means are a capacitor memory and a digital memory, respectively.

5. A feature extraction system according to claim 1, wherein said first means comprises a first memory means which receives said signal through a first gate circuit and a first comparator connected to receive said signal and connected to the output terminal of said first memory means, the output terminal of said first comparator being coupled with said first gate circuit, said second means comprises a second memory means coupled with said output terminal of said first memory means through a second gate circuit and a second comparator connected with said output terminals of said first and second memory means, the output terminal of said second comparator being coupled with said second gate circuit, and further includes fourth means for setting the initial conditions of said first and second memory means in response to pulse signals from said third means.

6. A feature extraction system according to claim 5, wherein said third means outputs at least one signal relating to parameters of said signal applied to said first means, and said first means further includes at least third memory means coupled with said third means through a third gate circuit in order to supply said signal relating to said parameters, said third gate circuit coupled with said output terminal of said first comparator, and said second means further includes at least fourth memory means coupled with the output terminal of said memory means through a fourth gate circuit, with which said output terminal of said second comparator is coupled.

7. A feature extraction system according to claim 6, wherein said first, second, third and fourth memory means comprise capacitor memories, respectively, the time constants of said first and third capacitor memories being shorter than those of said second and fourth capacitor memories.

8. A feature extraction system according to claim 7, wherein the settling time of said first capacitor memory is about 50 $n$ sec.

9. A feature extraction system according to claim 6, wherein said first and third memory means comprise capacitor memories, respectively and said second and fourth memory means comprise digital memories, respectively, the time constants of said first and third capacitor memories being so designed that they operate fast enough to respond to said signals applied to said first and third memory means.

10. A feature extraction system according to claim 6, wherein said first memory means comprises a capacitor memory, the time constant of which is so designed that it operates fast enough to respond to said signal applied to said first memory means, and the other memory means comprise digital memories, respectively.

11. A feature extraction system according to claim 6, wherein further includes fifth means comprising sixth and seventh memory means which is as same constructed as said first means and first and second gate means for coupling said first means and said fifth means to said second means, said sixth memory means coupled with said first means, said signal being supplied alternatively to said first and sixth memory means in response to gate signals from said third means, said first and second gate means coupled with said third means operating in such a manner that the contents of said first and third memory means are supplied to said second means when said signal is supplied to said sixth memory means whereas the contents of said sixth and seventh memory means are supplied to said second means when said signal is supplied to said first memory means.

12. A feature extraction system according to claim 1, which further includes fourth means to which at least one parameter corresponding to said signal is applied, fifth means connected with said first and fourth means, for storing the at least one parameter when the predetermined feature has been extracted by said first means, sixth means connected with said second and fifth means, for storing the at least one parameter in said fifth means when the optimum predetermined feature is extracted by said second means.

13. A feature extraction system for extracting an extreme value of the amplitude from a signal comprising:
first means for sequentially extracting the extreme value of said amplitude during a predetermined time period from the signal generated during the predetermined time period and for storing the extreme value, said first means extracting said extreme value during every predetermined time period;
second means connected with said first means, for extracting an optimum extreme value from the extreme values supplied from said first means at the end portion of the predetermined period and for storing the optimum extreme value; the second means having a signal holding time longer than that of said first means 14. A feature extraction system according to claim 13, which further includes third means having as an input at least one parameter corresponding to said signal, said third means connected with said first means, for storing the at least one parameter when the extreme value is extracted by said first means and fourth means connected with said second and third means, for storing the at least one parameter in said third means when the optimum extreme value is extracted by said second means.

15. A feature extraction system for extracting a maximum value of the amplitude from an input signal, comprising:
first means for receiving the input signal and for extracting the maximum value during a predetermined period from the signal applied during the predetermined period and storing the maximum value, said first means extracting said maximum value during every predetermined time period;
second means connected with said first means, for extracting a further maximum value from the maximum values extracted by said first means and for storing the further maximum value, the second means having a signal holding time longer than that of the first means.

* * * * *